(12) United States Patent
Moll

(10) Patent No.: US 6,977,538 B2
(45) Date of Patent: Dec. 20, 2005

(54) DELAY UNIT FOR PERIODIC SIGNALS

(75) Inventor: Joachim Moll, Herrenberg (DE)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/273,950

(22) Filed: Oct. 18, 2002

(65) Prior Publication Data

US 2004/0075482 A1    Apr. 22, 2004

(51) Int. Cl.[7] .......................................... H03H 11/26

(52) U.S. Cl. .................................... 327/276; 327/158

(58) Field of Search ........................ 327/276, 158, 327/159, 153, 149, 161, 270, 271, 277

(56) References Cited

U.S. PATENT DOCUMENTS

| | | | |
|---|---|---|---|
| 5,550,514 A * | 8/1996 | Liedberg | 331/1 A |
| 6,127,871 A | 10/2000 | Moll | 327/270 |
| 6,486,716 B1 * | 11/2002 | Minami et al. | 327/152 |
| 6,549,052 B2 * | 4/2003 | Okayasu | 327/276 |

* cited by examiner

Primary Examiner—Linh My Nguyen

(57) ABSTRACT

A delay unit for providing an output signal delayed by a delay time with respect to a periodic signal received at its input, the delay unit comprises a first delay cell adapted to receive the periodic signal and to provide as output a first delayed signal corresponding to the input periodic signal but delayed by a variable first delay time. A selection unit receives the first delayed signal and a second signal derived from the periodic signal. A control unit controls the selection unit in order to select one of the first delayed signal and the second signal as the output signal of the delay unit, and further controls the first delay time of the first delay cell.

18 Claims, 1 Drawing Sheet

DELAY UNIT FOR PERIODIC SIGNALS

BACKGROUND OF THE INVENTION

The present invention relates to delay units—or often referred to delay lines or delay cells—as frequently applied in order to delay an output signal by a certain delay time with respect to an input signal. Examples of delay units are disclosed e.g. in U.S. Pat. No. 6,127,871 by the same applicant and inventor, the teaching thereof shall be incorporated herein by reference.

SUMMARY OF THE INVENTION

It is an object of the present invention to provide an improved delay unit. The object is solved by the independent claims. Preferred embodiments are shown by the dependent claims.

According to the present invention, a delay unit comprises a first and a second delay cell, a selection unit, and a control unit. The delay unit receives as input a periodic signal coupled to inputs of both the first and second delay cells.

In operation, the first delay cell provides as output a first delayed signal corresponding to the input periodic signal but delayed by a first delay time. In other words, the first delay cell delays a characteristic timing feature of the periodic signal (such as in digital signals a transition e.g. between a high and a low level) by the first delay time, so that the timing of a corresponding characteristic timing feature in the first delayed signal is delayed by the first delay time with respect to the timing of the characteristic timing feature in the input periodic signal at the input of the first delay cell. Accordingly, the second delay cell provides as output a second delayed signal corresponding to the input periodic signal but delayed by a second delay time. The first and second delayed signals as outputs of the first and second delay cells are coupled to the selection unit.

Based on a degree of matching or coincidence in phase between the first and second delayed signals, the control unit controls the selection unit in order to select one of the first and second delayed signals as an output of the delay unit. The control unit further controls a setting of the first delay time of the first delay cell.

In a preferred embodiment, the control unit can derive the degree of matching or coincidence in phase between the first and second delayed signals from the knowledge of the period of periodic signal together with knowledge about the first and second delay times. Phase matching then applies when the difference between the first and second delay times is zero, the period, or multiples of the period.

In another embodiment, a phase detector is provided receiving the first and second delayed signals. The control unit receives an output of the phase detector representing the degree of matching or coincidence in phase between the first and second delayed signals. This embodiment allows encountering tolerances or deviations in accuracy of the delay cells.

While the first delay cell is provided as a variable delay having a variable first delay time adjustable (by the control unit) within a certain first delay time range between a minimum and a maximum first delay time, the second delay time of the second delay cell can be a fix value and even be zero (so that the second delay cell can be omitted in the latter case). However, providing the second delay cell with a variable second delay time can be of advantage in order to allow a delay sweep with almost no interrupts. In such case, the control unit might also control the (variable) second delay time.

In case the output of the delay unit is to be delayed with respect to the input periodic signal at its input by a delay time smaller to or equal than the maximum first delay time (as the maximum delay time applicable by the first delay cell), the control unit will set the requested delay time as the first delay time to the first delay cell and will further control the selection unit to select the output of the first delay cell as the output of the delay unit.

In order to sweep the delay time of the delay unit, i.e. varying the delay time from a start value to an end value, and assuming the start value being smaller than or equal to the maximum first delay time, the following procedure will be applied. The control unit sets the first delay time to the start value and selects the output of the first delay cell as the output of the delay unit. The control unit then starts sweeping the delay time in the sweep direction, i.e. from the start value towards the end value.

The control unit sweeps the delay time in the sweep direction towards the end value (preferably continuously in a fixed or variable sweep speed—in accordance with the requirements of the sweep and the characteristics of the first delay cell as well as the control unit) until an at least substantially matching between corresponding phases of the first and second delayed signals occurs. In response to the (at least substantially) phase matching (e.g. indicated by the phase detector), the control unit changes setting of the selection unit in order to select the second delayed signal as the output of the delay unit.

Further in response to the indicated phase matching, the control unit 'rewinds' the first delay cell by changing the first delay time in opposite sweep direction (i.e. in direction towards the start value) to a rewind value, where corresponding phases of the first and second delayed signals at least substantially match. The rewind value preferably is the next (as seen from the current value of the first delay time) value in opposite sweep direction where phase matching occurs, but may also be any further value where phase matching occurs.

In one embodiment, this rewinding is achieved in that the control unit sets the first delay time in the opposite sweep direction to either the minimum or the maximum first delay time and then again sweeps the first delay time in the sweep direction until the matching of corresponding phases occurs.

Once phase matching at the rewind value occurs, the control unit sets the selection unit to again select the first delayed signal as the output of the delay unit. The control unit will then further continue sweeping in the sweep direction. In case phase matching again occurs before the end value of the delay time sweep has been reached, the aforedescribed procedure of 'rewinding' will be applied again as often as required.

It is clear that the sweeping speed, i.e. the time for sweeping the delay time from the start to the end value, depends on the specific application and vary between a minimum system time (determined by minimum operation times of the involved components) and any arbitrary number. In the former case, such sweep basically represents a jump between the start to the end value.

In one embodiment wherein the second delay cell is provided having a variable second delay time, both delay lines can be used alternatingly to provide the sweep. During each sweep of one delay line, the other (unused) delay line will be reset or rewound. This allows providing a continuous sweep without rewinding breaks.

From the aforesaid, it becomes clear that the range of delay time sweeps is virtually unlimited, since the aforedescribed procedure can be continuously repeated (virtually without limitations). It is also clear that alternating delay time sweeps in opposite sweep directions can be applied accordingly.

In case a value (e.g. the start value) of the delay time to be provided by the delay unit is greater than the maximum first delay time, the control unit preferably subtracts one or more periods (of the periodic signal) from that value, at least until the remaining (subtracted) delay time is smaller than or equal to the maximum first delay time. The control unit will then set such remaining delay time as the first delay time of the first delay cell.

If the start value of the delay time is greater than the maximum delay time and one or more periods need to be subtracted, the number of subtracted periods are preferably considered, e.g. in a digital data generation block. This can be done e.g. by filling in additional zeroes at the beginning of the data stream, where the number of leading zeroes is equal to the number of subtracted periods in the delay unit.

In one embodiment, the maximum first delay time is selected to be equal to or greater than the period of the input periodic signal, and preferably to be equal to or at least slightly (e.g. 10%) greater than the maximum expected period of the input periodic signal. The second delay time is preferably selected to be at least the minimum first delay time. The maximum first delay time is then preferably selected to be at least one period greater than the second delay time. In case that both delay lines are provided as variable delay lines, then both minimum and maximum delay times are preferably selected to be substantially equal and preferably covering at least one period of the periodic signal.

In a preferred embodiment, at least one of the first and second delay cells is provided as a variable digital delay cell as disclosed in the aforementioned U.S. Pat. No. 6,127,871.

The input periodic signal can be without limitations any digital (e.g. a clock signal) or analog periodic signal.

The delay unit according to the present invention can be preferably applied for delaying the periodic signal with respect to a data signal derived from or otherwise coupled with the periodic signal. In a preferred embodiment, the periodic signal is a (preferably digital) clock signal, and the data signal is based on the clock signal. In one embodiment, such data signal is a stimulus signal for testing a device under test (DUT), while in another embodiment, such data signal is a response signal received from the DUT in response to a stimulus signal.

The invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

DETAILED DESCRIPTION OF EMBODIMENTS OF THE INVENTION

Figure 1:
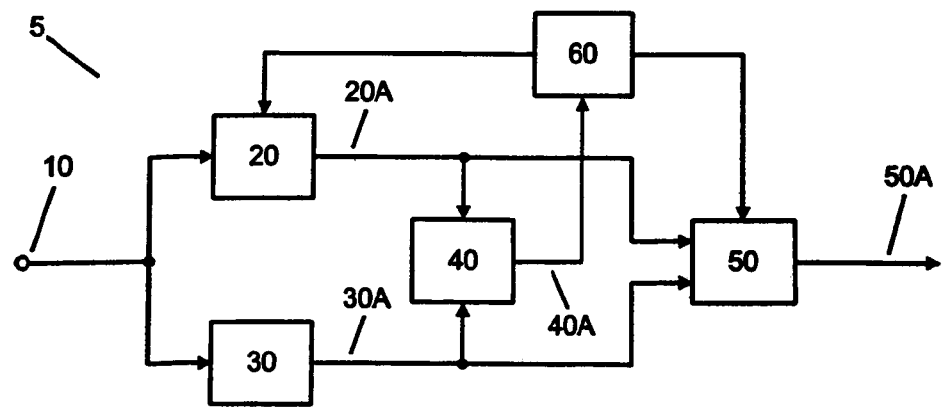
FIG. 1 shows a preferred embodiment according to the present invention.

In FIG. 1, a periodic signal 10, which can be a (preferably digital) clock signal, is applied to inputs of a first delay cell 20 and a second delay cell 30. An output 20A of the first delay cell 20 is delayed by a first delay time with respect to the periodic signal 10. Accordingly, an output 30A of the second delay cell is delayed by a second delay time with respect to the periodic signal 10. Both outputs 20A and 30A are applied to a phase detector 40 as well as to a selection unit 50. An output 40A of the phase detector is provided to a control unit 60, which controls setting of the first delay time of the first delay cell 20 as well as operation of the selection unit 50 in order to select either one of the outputs 20A and 30A as an output 50A of the delay unit 5.

While the first delay cell 20 is provided as a variable delay cell with a variable first delay time between a minimum first delay time and a maximum first delay time, the second delay cell can even be omitted (thus providing a 'zero' delay) or as a fixed delay having a fixed second delay time.

In operation for sweeping a delay time of the output 50A with respect to the input periodic signal 10 from a start value to an end value of the delay time, the following procedure is applied. In case the start value of the delay time is smaller than the maximum first delay time, the control unit 60 sets the first delay time as the start value. In order to cover the entire range of the period of the periodic signal, the maximum first delay time is selected to be equal to or greater than the period. In case the start value of the delay time sweep is greater than the maximum first delay time, the control unit 60 will subtract one or more periods from the start value at least until the remaining (subtracted) delay time is smaller than or equal to the maximum first delay time, and the control unit 60 then sets such remaining delay time as the first delay time of the first delay cell 20.

For providing the delay time sweep from the start value to the end value of the delay time, the control unit then increases or decreases (corresponding to the sweep direction) the first delay time towards the end value of the delay time, preferably continuously or in sweep steps with a sweep speed controlled by the control unit 60. During such sweep and until the phase detector 40 detects a phase matching between outputs 20A and 30A, the control unit 60 controls the selection unit 50 to provide the output 20A as the output 50A.

Once the phase detector 40 detects phase matching between the outputs 20A and 30A and signals that via output 40A to the control unit 60, the control unit 60 instructs the selection unit 50 to change output 30A as the output 50A and 'rewinds' the first delay time. 'Rewinding' means changing the first delay time in opposite sweep direction to a value, where the phases of the outputs 20A and 30A match. In case of an increasing delay time sweep, this can be accomplished by resetting the first delay time to the minimum first delay time and then continuously increasing the first delay time until the phase detector 40 indicates phase matching between the outputs 20A and 30A. Accordingly in case of a decreasing delay time sweep, the control unit 60 can reset the first delay time to the maximum first delay time and continuously decrease the first delay time until the phase detector 40 indicates the phase matching between the outputs 20A and 30A. However, any other algorithm can be applied accordingly.

Once the first delay time is 'rewound' and phase matching between the outputs 20A and 30A is indicated, the control unit 60 instructs the selection unit 50 to again change to the output 20A as the output 50A and continues the delay time sweep in the sweep direction towards the end value by increasing or decreasing the first delay time.

In case phase matching is indicated before the end value has been reached, the aforedescribed rewinding of the first delay time together with the changing of outputs 20A or 30A as the output 50A can be applied repeatedly as often as required. It is clear that such sweeping can be provided virtually endlessly in any arbitrary range and direction of the delay time sweep.

Figure 2:
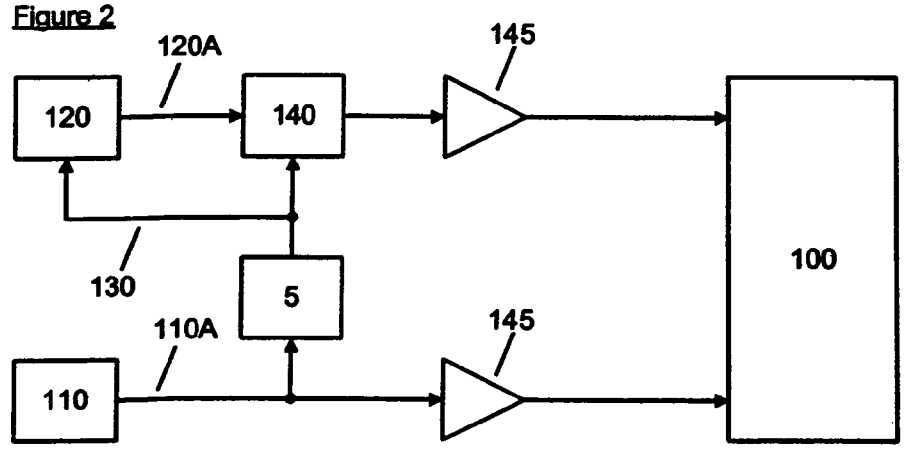
FIGS. 2 and 3 show preferred applications of the delay unit according to the present invention.
Figure 3:
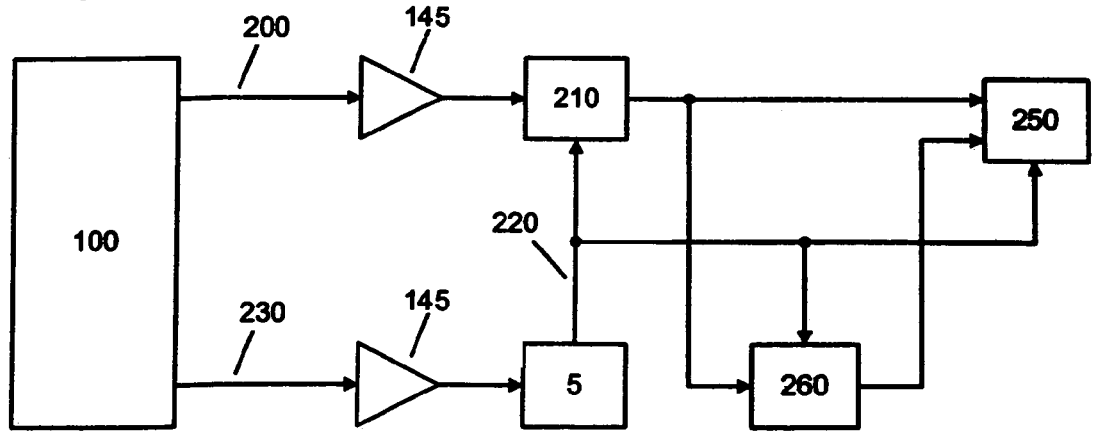

FIGS. 2 and 3 show preferred applications of the delay unit 5. In FIG. 2, a device under test (DUT) 100 is to receive a clock signal 110A provided from a clock generator 110. For testing the DUT 100, a data generator 120 generates a stimulus signal 120A to be applied to the DUT 100. The delay unit 5 is provided between the clock generator 110 and the data generator 120 in order to set a delay time between the clock signal 110A (as provided to the DUT 100) and the a clock signal 130 applied to the data generator for generating the stimulus signal 120A. This signal can be retimed (sampled) in a retimer 140 to generate a signal with low data dependant jitter. Both, the data signal and the clock are sent to amplifiers 145 before being connected to the DUT.

While the delay unit 5 in FIG. 2 is applied in the stimulus path for testing the DUT 100, FIG. 3 illustrates an application of the delay unit 5 in a response path for receiving response signals 200 from the DUT 100 in response to an applied stimulus (not shown in FIG. 3, but which might be or result from the stimulus path of FIG. 2). The response signals 200 are provided to and sampled by a sampling unit 210, which further receives a sampling clock signal 220 from the delay unit 5. The delay unit 5 receives a DUT clock signal 230 from the DUT 100 and outputs the sampling clock signal 220 as the DUT clock signal 230 delayed by the delay time of the delay unit 5. Instead of the received DUT clock signal 230, the delay unit 5 might use an internal clock (at least substantially corresponding in frequency with the DUT clock signal 230) or recover a clock signal from the response signals 200, as disclosed in detail in the pending European Patent Application Nr. 02017334.0 the teaching of which shall be incorporated herein by reference.

A comparator 250 receives and compares a sampled output of the sampling unit 210 with an expected data as stored e.g. in memory 260, sampling unit 210, comparator 250 and memory 260 being controlled by the sampling clock signal 220, as well known in the art.

What is claimed is:

1. A signal unit comprising a delay unit configured for providing an output signal delayed by a delay time with respect to a periodic signal received at its input, the delay unit including:
   a first delay cell configured to receive the periodic signal and to provide as output a first delayed signal corresponding to the input periodic signal but delayed by a variable first delay time,
   a selection unit configured to receive the first delayed signal and a second signal derived from the periodic signal,
   a control unit configured to control the selection unit in order to select one of the first delayed signal and the second signal as the output signal of the delay unit, and to control the first delay time of the first delay cell,
wherein the signal unit is configured for delaying a periodic signal with respect to a data signal derived from or otherwise coupled with the periodic signal and the data signal is a stimulus signal for testing a device under test.

2. The delay unit of claim 1, wherein the control unit controls the selection unit based on a degree of matching or coincidence in phase between the first delayed signal and the second signal.

3. The delay unit of claim 2, wherein:
   the control unit controls the selection unit to select during a normal operation the first delayed signal and to select during a rewinding operation the second signal,
   the rewinding operation is initiated as well as ended when the phases of the first delayed signal and the second signal at least substantially match,
   and the control unit modifies the first delay time during the rewinding operation.

4. The delay unit of claim 1, wherein the variable first delay time is adjustable within a first delay time range between a minimum and a maximum first delay time.

5. The delay unit of claim 1, wherein the first delay cell delays a characteristic timing feature of the periodic signal by the first delay time, so that the timing of a corresponding characteristic timing feature in the first delayed signal is delayed by the first delay time with respect to the timing of the characteristic timing feature in the input periodic signal at the input of the first delay cell.

6. The delay unit of claim 1, wherein the second signal is the periodic signal or a second delayed signal as the periodic signal delayed by a second delay time.

7. The delay unit of claim 1, further comprising a second delay cell configured to receive the periodic signal and to provide as output the second signal as a second delayed signal corresponding to the input periodic signal but delayed by a second delay time.

8. The delay unit of claim 1, wherein the output of the delay unit is to be delayed with respect to the input periodic signal at its input by a delay time smaller to or equal than a maximum first delay time as the maximum delay time applicable by the first delay cell, the control unit being configured to set the first delay time as the delay time and to control the selection unit to select the first delayed signal as the output of the delay unit.

9. The delay unit of claim 1, wherein the delay time of the delay unit is to be swept in a sweep direction from a start value to an end value, the control unit being configured to execute the following steps:
   (a) setting the first delay time to the start value and controlling the selection unit to select the first delayed signal as the output of the delay unit,
   (b) sweeping the delay time in the sweep direction, and
   (c) in case that corresponding phases of the first delayed signal and the and second signal at least substantially match before step (b) has reached the end value, executing the following steps:
      i. in response to the phase matching, controlling the selection unit in order to select the second signal as the output of the delay unit,
      ii. changing the first delay time in opposite sweep direction to a rewind value, where corresponding phases of the first delayed signal and the second signal at least substantially match,
      iii. controlling the selection unit in order to select the first delayed signal as the output of the delay unit, and
      iv. continue with step (b).

10. The delay unit of claim 9, wherein in the step (c) iii. the rewind value is the next value in opposite sweep direction where phase matching occurs.

11. The delay unit of claim 9, wherein the step (c) iii. further comprises the steps of:
   setting the first delay time in the opposite sweep direction to either the minimum or the maximum first delay time, and
   sweeping the first delay time in the sweep direction until the phase detector monitors the matching of corresponding phases.

12. The delay unit of claim 1, wherein the control unit is adapted to subtract one or more periods of the periodic signal from a value of the delay time to be provided by the delay unit, at least until the remaining delay time is smaller than or equal to the maximum first delay time, and to set such remaining delay time as the first delay time of the first delay cell.

13. The delay unit of claim 1, wherein the maximum first delay time is selected to be equal to or greater than the period of the input periodic signal.

14. The delay unit of claim 1, wherein the input periodic signal is one of a digital or an analog periodic signal.

15. The delay unit of claim 1, wherein the input periodic signal is a clock signal.

16. The delay unit of claim 1, further comprising a phase detector configured to receive the first delayed signal and the second signal in order to provide as an output representing the degree of matching or coincidence in phase between the first delayed signal and the second signal.

17. A signal unit comprising a delay unit configured for providing an output signal delayed by a delay time with respect to a periodic signal received at its input, the delay unit including:
   a first delay cell configured to receive the periodic signal and to provide as output a first delayed signal corresponding to the input periodic signal but delayed by a variable first delay time,
   a selection unit configured to receive the first delayed signal and a second signal derived from the periodic signal,
   a control unit configured to control the selection unit in order to select one of the first delayed signal and the second signal as the output signal of the delay unit, and to control the first delay time of the first delay cell,
wherein the signal unit is configured for delaying a periodic signal with respect to a data signal derived from or otherwise coupled with the periodic signal and the data signal is a response signal received from a device under test in response to a stimulus signal applied to the device under test.

18. A method for providing an output signal delayed by a delay time with respect to an input periodic signal, the method comprising the steps of:
   receiving the periodic signal and providing as output a first delayed signal corresponding to the input periodic signal but delayed by a variable first delay time,
   deriving a second signal from the periodic signal,
   selecting one of the first delayed signal and the second signal as the output signal in response to a degree of matching or coincidence in phase between the first delayed signal and the second signal,
   controlling the first delay time, and
   utilizing the output signal for delaying a periodic signal with respect to a data signal derived from or otherwise coupled with the periodic signal, wherein the data signal is a stimulus signal for testing a device under test.

\* \* \* \* \*